United States Patent
Zhang et al.

(10) Patent No.: US 7,002,869 B2
(45) Date of Patent: Feb. 21, 2006

(54) VOLTAGE REGULATOR CIRCUIT

(75) Inventors: Pyung-Moon Zhang, Gyeonggi-do (KR); Seung-Keun Lee, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 27 days.

(21) Appl. No.: 10/794,532

(22) Filed: Mar. 5, 2004

(65) Prior Publication Data

US 2004/0174150 A1    Sep. 9, 2004

(30) Foreign Application Priority Data

Mar. 6, 2003   (KR) .................. 10-2003-0014048

(51) Int. Cl.
*G11C 7/00* (2006.01)
(52) U.S. Cl. .................. 365/226; 365/189.09; 341/144
(58) Field of Classification Search ................ 365/226, 365/189.09; 341/144, 154
See application file for complete search history.

(56) References Cited

U.S. PATENT DOCUMENTS

| | | | | |
|---|---|---|---|---|
| 5,119,095 A | * | 6/1992 | Asazawa ................. | 341/154 |
| 6,002,354 A | * | 12/1999 | Itoh et al. ............... | 341/144 |
| 6,061,289 A | * | 5/2000 | Itoh et al. ............... | 365/226 |

* cited by examiner

*Primary Examiner*—Bao Q. Vu
(74) *Attorney, Agent, or Firm*—Marger Johnson & McCollom, P.C.

(57) ABSTRACT

A voltage regulator circuit and a semiconductor memory device using the same are provided. The voltage regulator circuit regulates an input voltage to provide an output voltage. The voltage regulator circuit comprises a voltage divider to divide the output voltage, a comparator to determine whether the divided voltage is less than a reference voltage, a driver connected between the input voltage and the output voltage, and operating operate responsive to the comparator, and a controller to control the voltage divider to gradually vary the output voltage. The voltage divider includes a resistance that operates responsive to the controller and whose value varies in a binary weighted form.

25 Claims, 10 Drawing Sheets

Voltage Regulator

VOLTAGE REGULATOR CIRCUIT

This application claims priority of Korean Patent Application No. 2003-14048, filed on Mar. 6, 2003, in Korea Intellectual Property Office, the disclosure of which is incorporated herein in its entirety by reference.

BACKGROUND OF THE INVENTION

1. Field of the Invention

The present invention relates to a semiconductor device and, more particularly, to a semiconductor device including a voltage regulator circuit.

2. Description of the Related Art

Common voltage regulator circuits regulate an output voltage responsive to an input reference voltage. The voltage regulator circuit feeds back the regulated output voltage to a comparator through a resistor circuit. The resistor circuit varies its resistance such that a voltage regulator circuit provides various required voltage levels for operating a semiconductor memory device and, more specifically, for operating a non-volatile semiconductor memory device.

Accordingly, the common voltage regulator circuit includes a voltage divider having a plurality of resistors and a plurality of switches. Only one switch is selected at any given time to control the resistance value of the voltage divider. The common voltage regulator circuit has a drawback in that its resistors and the switches increase in number proportional to the voltage levels required by the device.

SUMMARY OF THE INVENTION

It is an object of the present invention to provide an improved voltage regulator circuit and semiconductor memory device employing the same.

It is another object of the present invention to provide an improved voltage regulator circuit having a reduced area.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

In an aspect of the present invention, there is provided a voltage regulator circuit to regulate an input voltage and generate an output voltage. The voltage regulator circuit includes a voltage divider to generate a divided voltage. A comparator compares the divided voltage to a reference voltage. A driver connects between an input voltage and an output voltage, the driver operating responsive to the comparator. A controller controls the voltage divider with a control signal to gradually vary the output voltage. The voltage divider comprises a resistance that varies in a binary weighted form responsive to the controller.

The controller comprises a counter to generate a control code responsive to a clock signal.

The voltage divider includes a plurality of weighted resistors and a plurality switches each connected in parallel to a corresponding weighted resistor and operating responsive to the control code.

The weighted resistors corresponding to a least significant bit of the control code has a smallest resistance value and the weighted resistor corresponding to the most significant bit of the control code has a largest resistance value.

Each of the includes first and second level shifters to receive corresponding control code bit signals, an inverter to receive an output signal from the first level shifter, and a transmission gate connected in parallel with a corresponding weighted resistor and operating responsive to the inverter and the second level shifter.

The first level shifter operates at a voltage larger than a power supply voltage and the second level shifter operates at the output voltage.

Switches receiving least significant bits of the control code include first and second level shifters to receive corresponding control codes, an inverter to receive an output signal from the first level shifter, and a transmission gate connected in parallel with a corresponding weighted resistor and operating responsive to inverter and the second level shifter.

Switches receiving most significant bits of the control code include a third level shifter to receive a corresponding control code and an NMOS transistor parallel connected with a corresponding weighted resistor, and operating responsive to the third level shifter.

The first and third level shifters operate at a voltage larger than a power supply voltage and the second level shifter operates at the output voltage.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings illustrate but do not limit embodiments of the invention.

DETAILED DESCRIPTION OF THE INVENTION

Reference will now be made in detail to embodiments of the present invention, examples of which are illustrated in the accompanying drawings. The present invention is not limited to the embodiments illustrated here. The embodiments are rather exemplary and provide an easy and complete understanding of the scope and spirit of the present invention.

Figure 1:
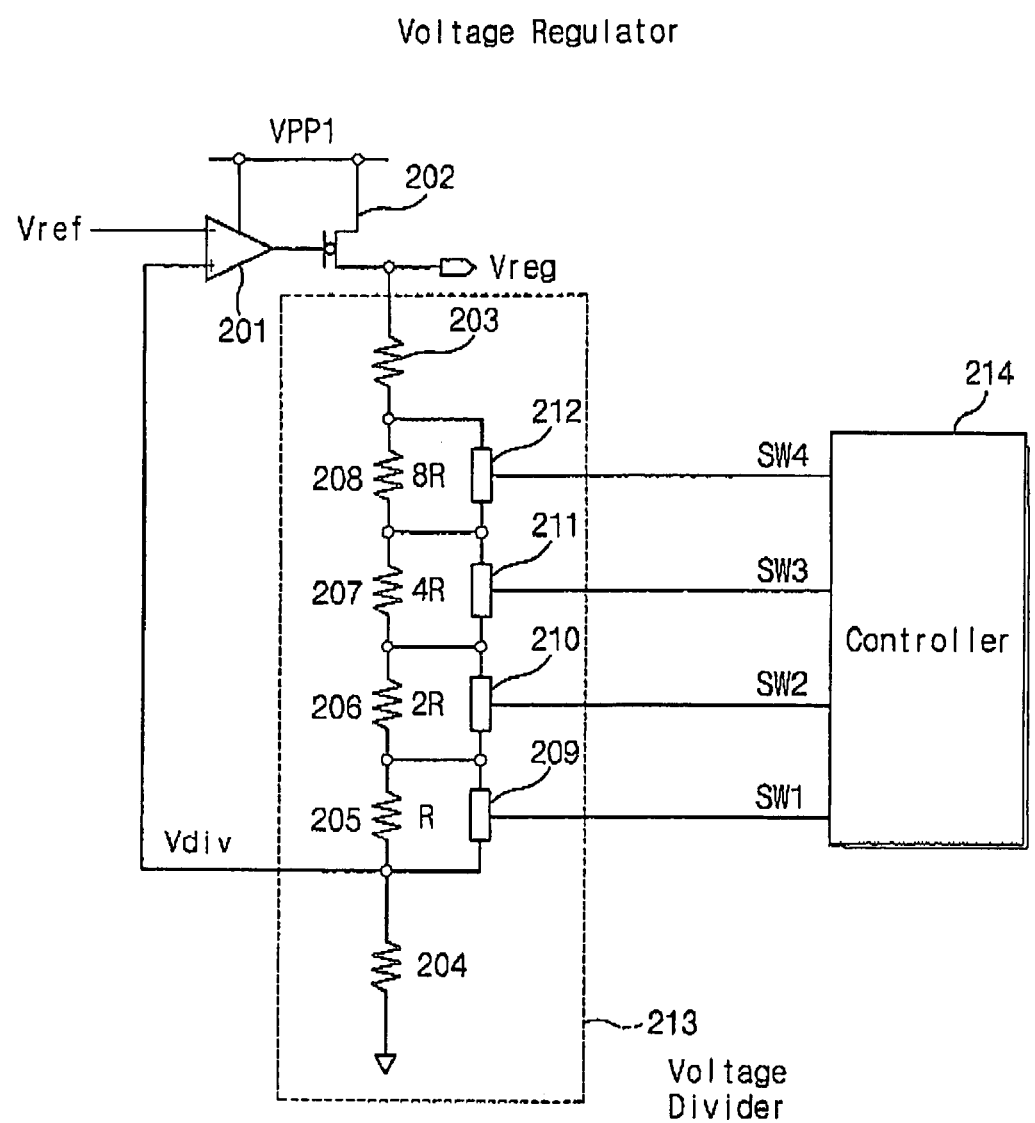
FIG. 1 is a circuit diagram of a voltage regulator circuit.

FIG. 1 is a circuit diagram of a voltage regulator circuit. Referring to FIG. 1, the inventive voltage regulator circuit includes a comparator 201, a PMOS driver transistor 202, a voltage divider 213, and a controller 214.

The comparator 201 receives a reference voltage Vref and a divided voltage Vdiv from the voltage divider 213, and determines whether the divided voltage Vdiv is less than the reference voltage Vref. The PMOS driver transistor 202 is connected between a high voltage VPP1 and a regulated voltage Vreg. The PMOS driver transistor 202 operates responsive to comparator 201. The voltage divider 213 divides the regulated voltage Vreg responsive to the controller 214 and provides the result to the comparator 201.

The voltage divider 213 includes a plurality of switches 209, 210, 211, and 212 and a plurality of serially connected resistors 203, 204, 205, 206, 207, and 208 between the regulated voltage Vreg and a ground voltage. In an embodiment, resistors 205 to 208 are weighted and resistors 203 and 204 are uniform or single value. For example, if the resistor 205 has a resistance value R, the resistors 206, 207, and 208 have resistance values 2R, 4R, and 8R, respectively. Weighted resistors 205 to 208 are parallel connected to corresponding switches 209 to 212 respectively. The switches 209 to 212 are turned on or off responsive to control signals SW1, SW2, SW3, and SW4 from the controller 214. The controller 214 controls the voltage divider 213 such that the divided voltage Vdiv is gradually decreases and the regulated voltage Vreg gradually increases.

The voltage regulator circuit operates as follows. If the regulated voltage Vreg is less than a required voltage level (i.e., if Vref>Vdiv), a current is supplied from the PMOS transistor 202 that increases the regulated voltage Vreg to the required voltage level. On the other hand, if the regulated voltage Vreg is more than a required voltage level (i.e., if Vref<Vdiv), the PMOS transistor 202 turns off, cutting off the current supply to decrease the regulated voltage Vreg to the required voltage level.

In this embodiment, control signals SW1 to SW4 constitute a 4-bit control code. The control signal SW1 corresponds to a least significant bit (LSB) and the control signal SW4 corresponds to a most significant bit (MSB) of the control code. The resistor 205 corresponding to the LSB of the control code has the smallest resistance value. The resistor 208 corresponding to the MSB of the control code has the largest resistance value.

When the control code SW4SW3SW2SW1 is "0000", the switches 209 to 212 turn on. A current path between the resistors 203 and 204 is formed through the switches 209 to 212. At this time, the least-leveled regulated voltage Vreg will be output. When the control code SW4SW3SW2SW1 is "0001", the switch 209 is turns off and switches remaining 210 to 212 turn on. The current path between the resistors 203 and 204 is formed through the switches 210 to 212 and the weighted resistor 205. Accordingly, the regulated voltage Vreg is increased by ΔR. When the control code SW4SW3SW2SW1 is "0010", the switch 210 turns off and the switches 209, 211, and 212 are turn on. The current path of the resistors 203 and 204 is formed through the switches 209, 211, and 212 and the weighted resistor 206. At this time, the regulated voltage Vreg is increased by ΔR. Thus, as a value of the control code SW4SW3SW2SW1 is increases gradually, the regulated voltage Vreg also increases gradually.

The voltage regulator shown in FIG. 1 includes four weighted resistors and four switches to provide a regulated voltage Vreg that might vary gradually or stepwise (e.g., a 16-level regulated voltage Vreg). A person of reasonable skill in the art should recognize that the number of resistors both weighted and uniform, as well as, switches might vary without departing from the scope of the invention. If uniform resistors replace the weighted resistors, more uniform resistors and switches are necessarily used to provide, e.g., a 16-level regulated voltage Vreg.

Figure 2:
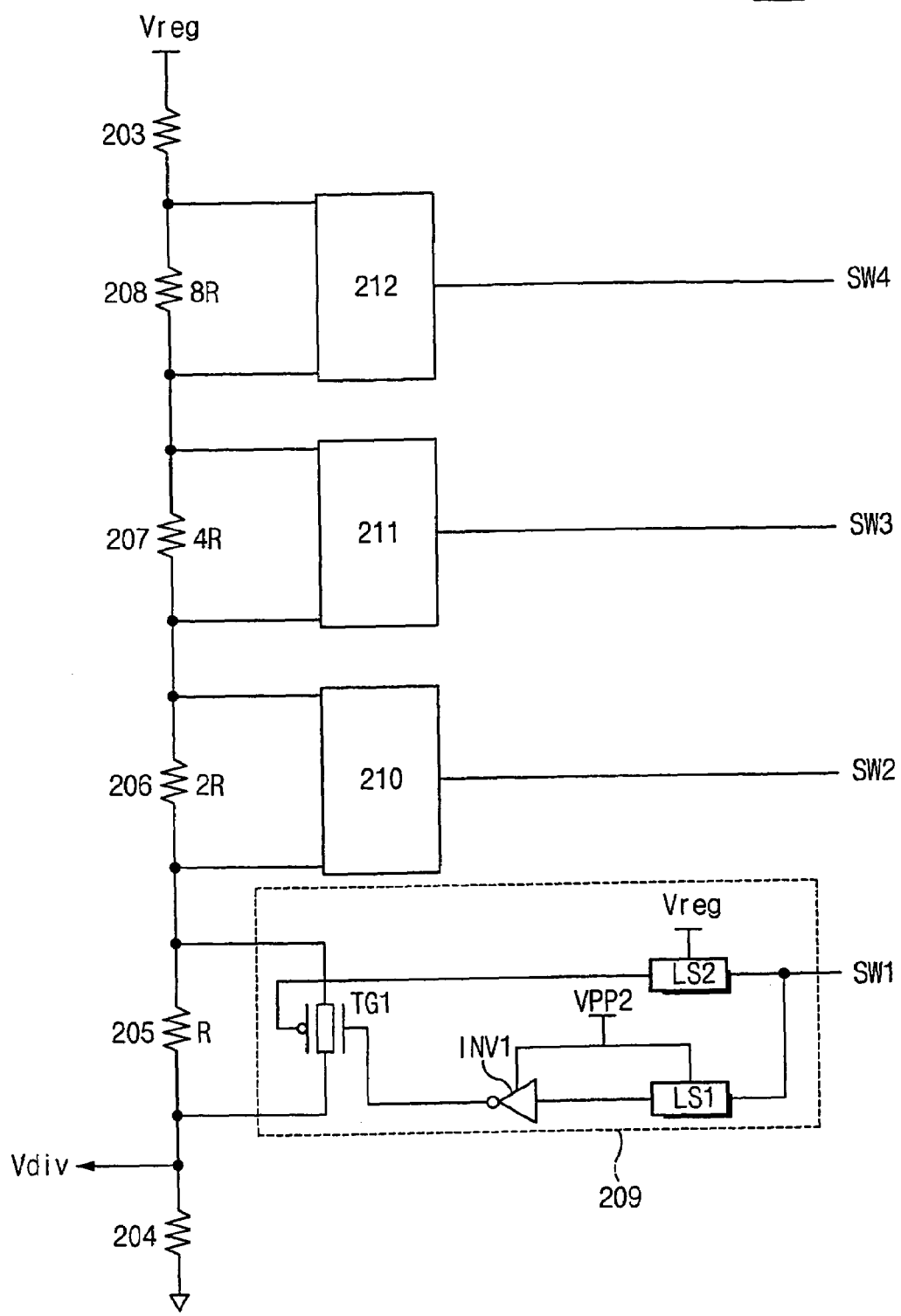
FIG. 2 is a circuit diagram of the switch shown in FIG. 1.

FIG. 2 is a circuit diagram of the switches shown in FIG. 1. Referring to FIG. 2, the switch 209 bypasses a signal path of the weighted resistor 205 responsive to the control signal SW1. The switch 209 includes a transmission gate TG1, level shifters LS1 and LS2, and an inverter INV1. The remaining switches 210, 211, and 212 each have the same construction as the switch 209. The level shifter LS1 operates at leveled high voltage VPP2 and the level shifter LS2 operates at an output voltage Vreg.

Figure 3:
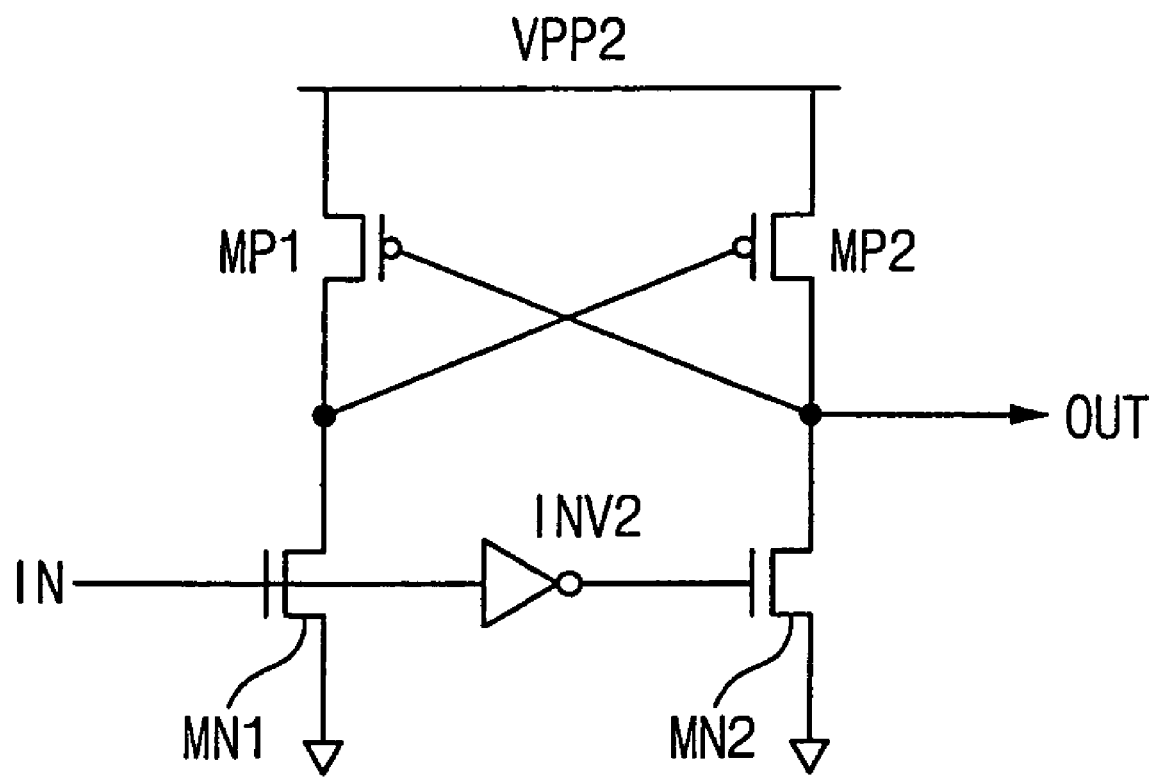
FIG. 3 is a circuit diagram of the level shifter shown in FIG. 2.

FIG. 3 is a circuit diagram of the level shifter LS1 or LS2 shown in FIG. 2. Referring to FIG. 3, the level shifter LS1/LS2 includes PMOS transistors MP1 and MP2, an inverter INV2, and NMOS transistors MN1 and MN2. When an input signal IN is at a low level, an output signal OUT is at a low level. When the input signal IN is at a high level, the output signal OUT is at high voltage VPP2. Thus, when the control signal SW1 is at the high level, the transmission gate TG1 is not conductive, and a bypass path of the weighted resistor 205 is cut off. When the control signal SW1 is at the low level, the transmission gate TG1 is conductive, and the bypass path of the weighted resistor 205 is turned on.

Figure 4A:
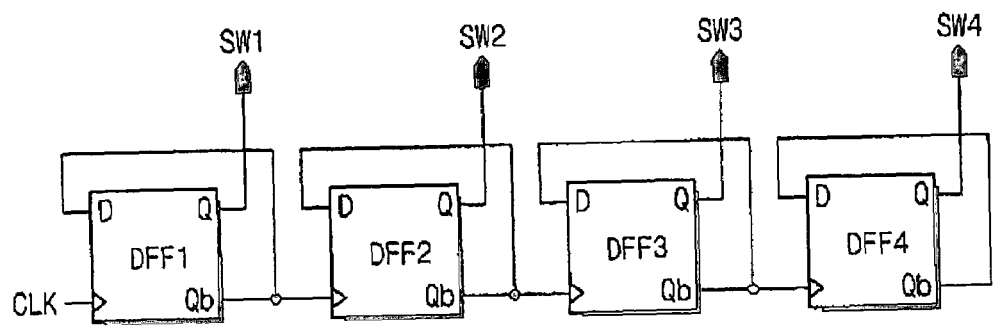
FIG. 4A is a circuit diagram of the controller shown in FIG. 1.
Figure 4B:
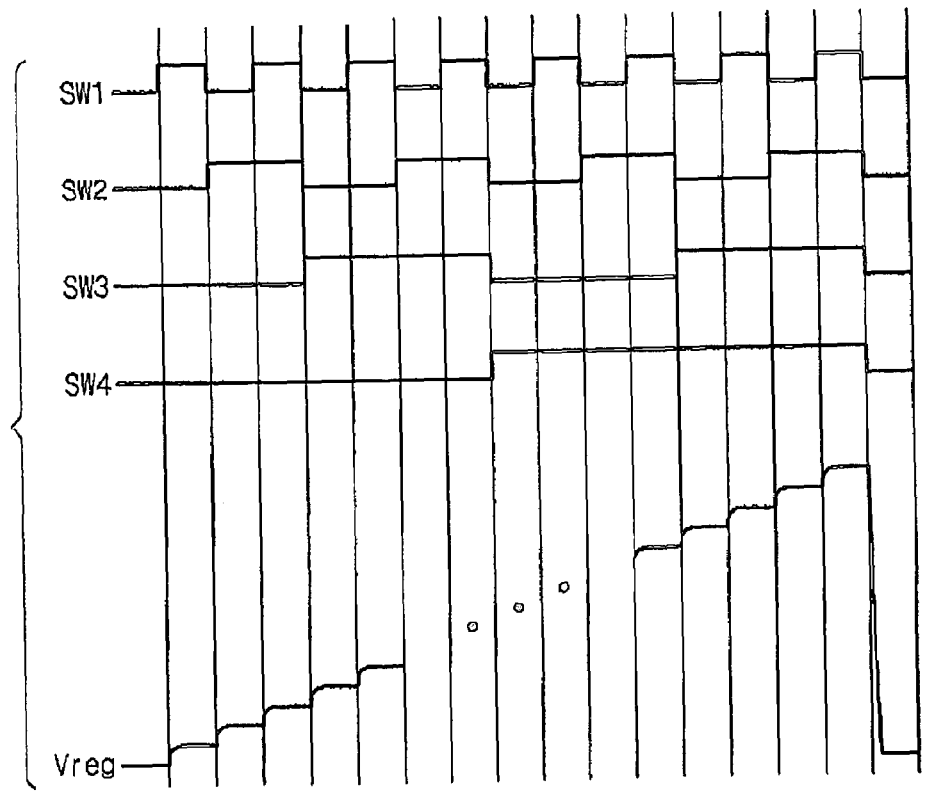
FIG. 4B is a timing diagram of the controller shown in FIG. 4A.

FIG. 4A is a circuit diagram of the controller 214 shown in FIG. 1. FIG. 4B is a timing diagram of the operation of controller 214. Referring to FIG. 4A, the controller 214 comprises a binary counter that is synchronized with a clock signal CLK. The counter includes four serially connected D flip-flops DFF1, DFF2, DFF3, and DFF4. As shown in FIG. 4B, the regulated voltage Vreg increases stepwise as the control signals SW1 to SW4 and, more particularly, the control codes are synchronized to the clock signal CLK to vary gradually in synchronism with the clock signal CLK.

For example, when the control code SW4SW3SW2SW1 is "0000", the switches 209 to 211 turn on, and the current path between the resistors 203 and 204 is formed through the switches 209 to 212. At this time, the lowest leveled regulated voltage Vreg is output. When the control code SW4SW3SW2SW1 is "0001", the switch 209 is turns off and the remaining switches 210 to 212 turn on. The current path of the resistors 203, 204 is formed through the switches 210–212 and the weighted resistor 205. Accordingly, the regulated voltage Vreg is increased by ΔR. When the control code SW4SW3SW2SW1 is "0010", the switch 210 turns off, the remaining switches 209, 211, and 212 turn on, and the current path between the resistors 203 and 204 is formed through the switches 209, 211, and 212 and the weighted resistor 206. At this time, the regulated voltage Vreg increases by ΔR. As a result, as the value of the control code SW4SW3SW2SW1 gradually increases, the regulated voltage Vreg also gradually increases.

Figure 5:
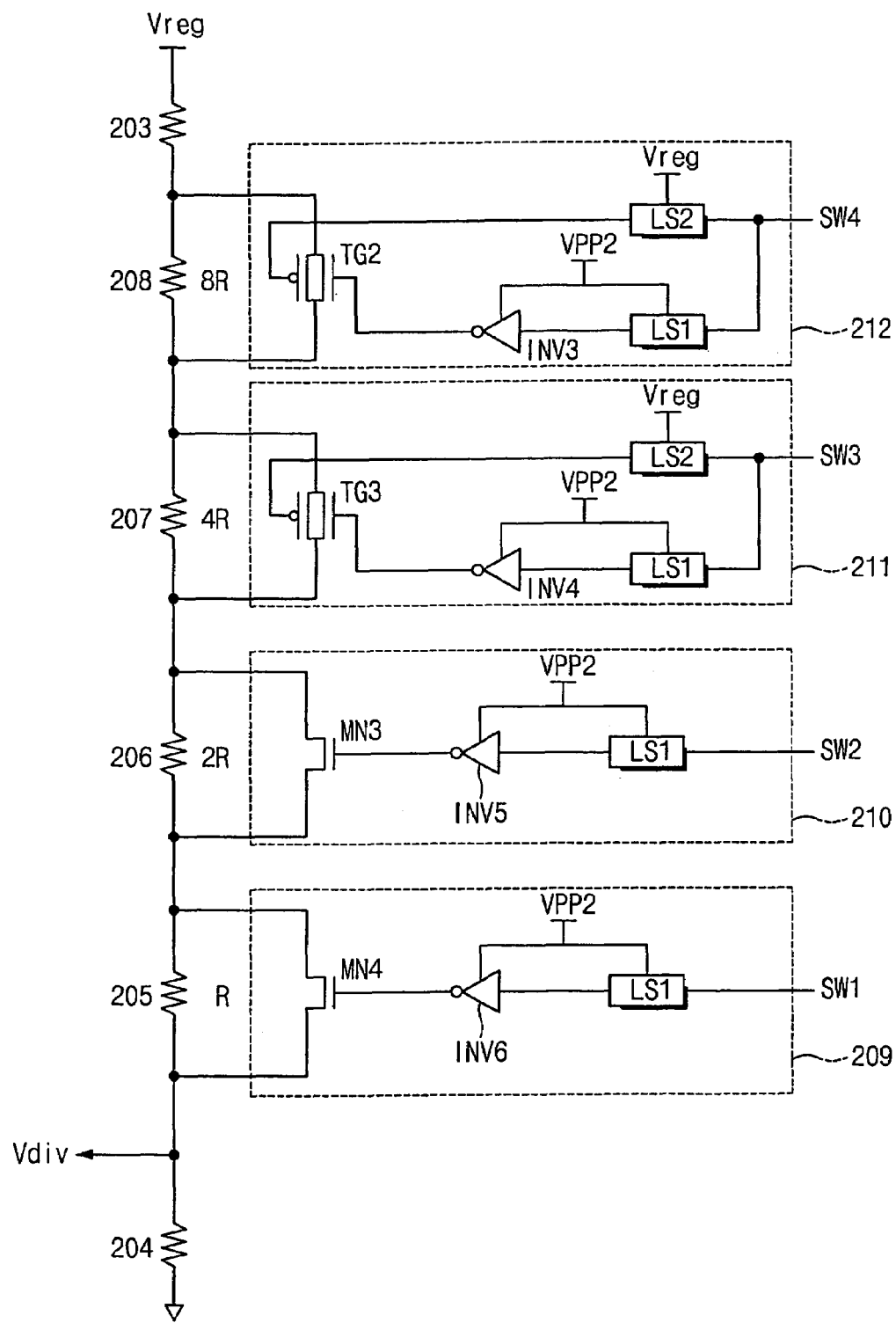
FIG. 5 is a circuit diagram of the switch shown in FIG. 1.

In this embodiment, the number of flip-flops constituting the counter 214 will be determined depending on the number of the voltage levels of the regulated voltage Vreg. For instance, in case of a 16 stage ($2^4$)-varying regulated voltage Vreg, four flip-flops are required. In case of a 32 stage ($2^5$)-varying regulated voltage Vreg, five flip-flops are required, and so on FIG. 5 is a circuit diagram of an alternative embodiment of the switches shown in FIG. 1. Referring to FIG. 5, the switches 209 and 210 for receiving lower control signals SW1 and SW2 have a different construction from the switches 211 and 212 for receiving upper signals SW3 and SW4. In other words, the switches 209 and 210 are respectively comprised of an NMOS transistor and a level shifter, while the switches 211 and 212 are respectively comprised of a transmission gate, an inverter, and level shifters. In the switches 209 and 210, the level shifter operates at the voltage VPP2 less than the high voltage VPP1 supplied to the voltage regulator circuit.

Figure 6A:
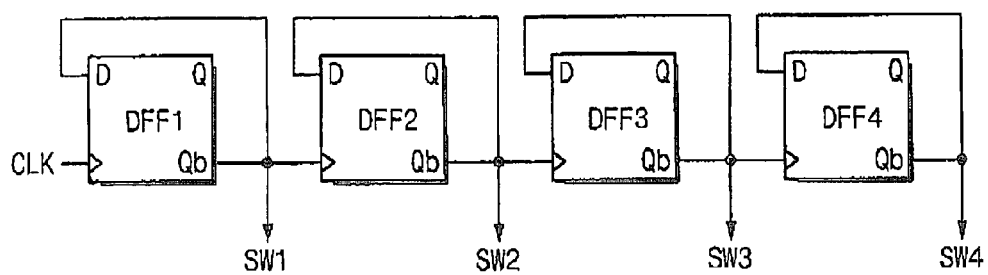
FIG. 6A is a circuit diagram of the controller shown in FIG. 1.
Figure 6B:
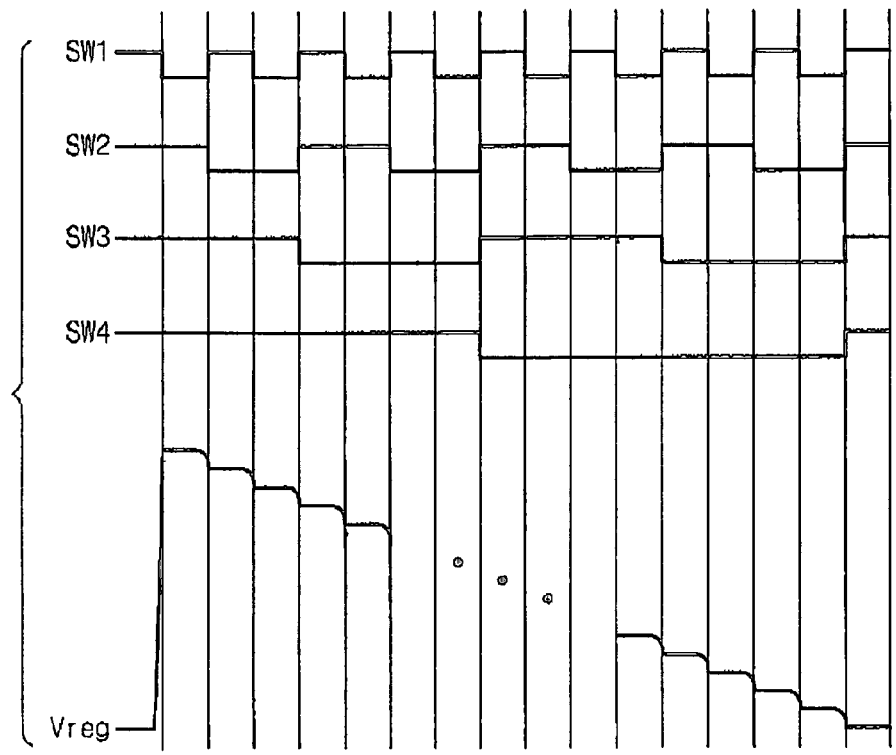
FIG. 6B is a timing diagram of the controller shown in FIG. 6A.

It is obvious to the person skilled in the art that the voltage regulator circuit can be designed such that the regulated voltage Vreg can be gradually reduced as the control signals SW1 to SW4 from the controller 214 vary sequentially in synchronism with the clock signal CLK. For example, as shown in FIGS. 6A and 6B, this can be achieved by replacing an up counter with a down counter in the controller 214'. In case of the down counter in the controller 214', complementary output signals Qb of D flip-flops DFF1'–DFF4' are used as the control signals SW1 to SW4.

Figure 7:
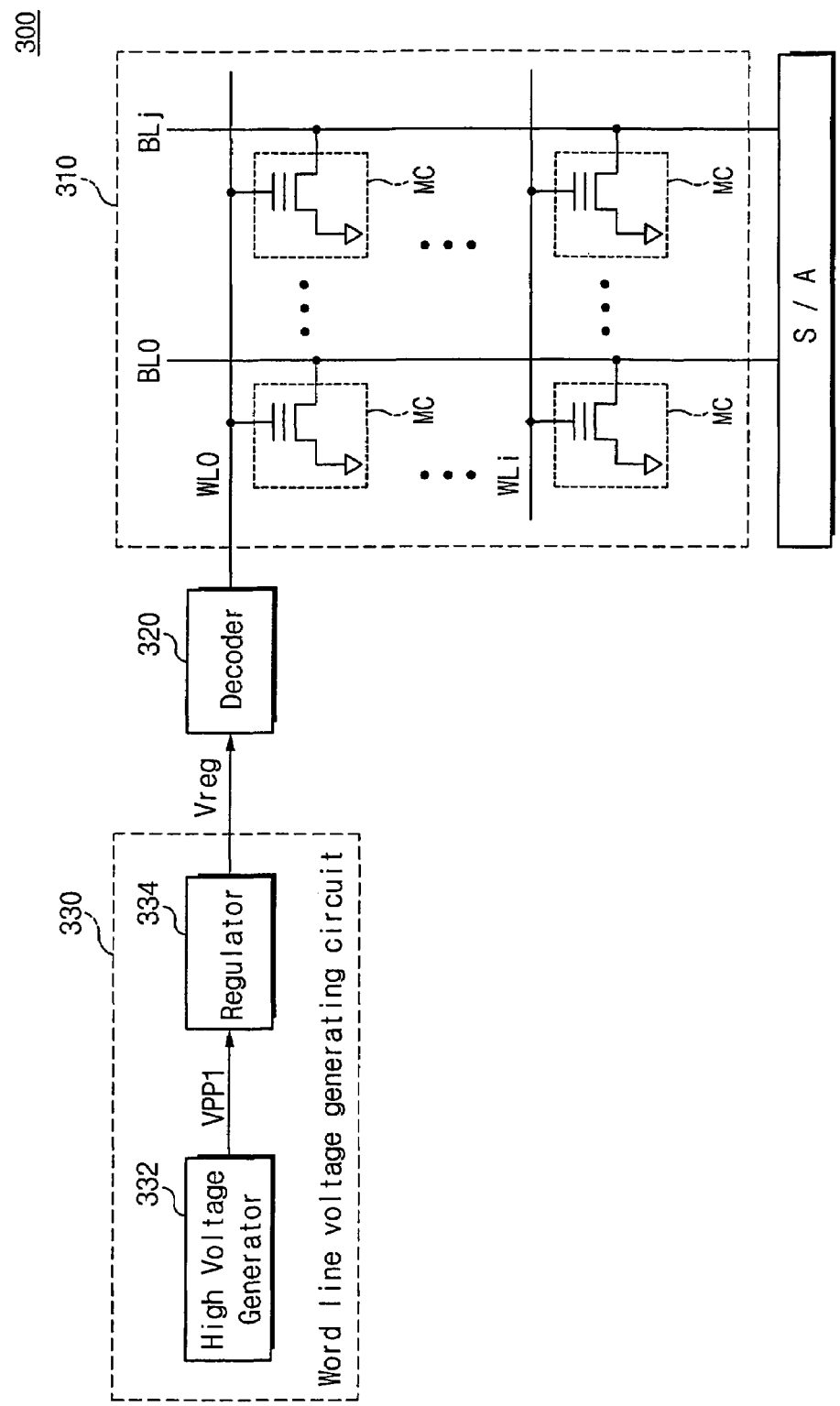
FIG. 7 is a block diagram of a non-volatile semiconductor memory device.

FIG. 7 is a schematic block diagram of a non-volatile semiconductor memory device. Referring to FIG. 7, the non-volatile semiconductor memory device 300 includes an array 310 of memory cells arranged in a matrix of rows (e.g., word lines, WL0–WLi) and columns (e.g., bit lines, BL0–BLj). Each of the memory cells MC is a non-volatile memory cell for storing single-bit data information such as "0" and "1". Or, each of the memory cells stores multi-bit data information such as "00", "01", "10" and "11". A decoder 320 selects one among the rows depending on selection information (e.g., row address information), and supplies the selected row with a word line voltage. A person of reasonable skill in the art knows well the construction and design of the decoder 320.

A word line voltage generating circuit 330 outputs the regulated voltage Vreg to the decoder 320 as the word line voltage supplied for the selected row. The word line voltage generating circuit 330 includes a high voltage generator 332 and voltage regulator 334, the voltage generator 332 generates a high voltage VPP1 larger than a power supply voltage. The voltage regulator 334 sets the high voltage VPP1 to the regulated voltage Vreg. The voltage regulator 334 is supplied with the high voltage VPP1 to output variously-leveled regulated voltages Vreg. For example, the voltage regulator 334 outputs voltages respectively required for read, erase, erase verification, program, and program verification operations of the non-volatile semiconductor memory device. As well known to the art, the program voltage gradually increases at a program cycle, while the read, erase, and verification voltages are maintained constant at a corresponding operation (e.g., erase/read/verification operations) cycle.

Figure 8:
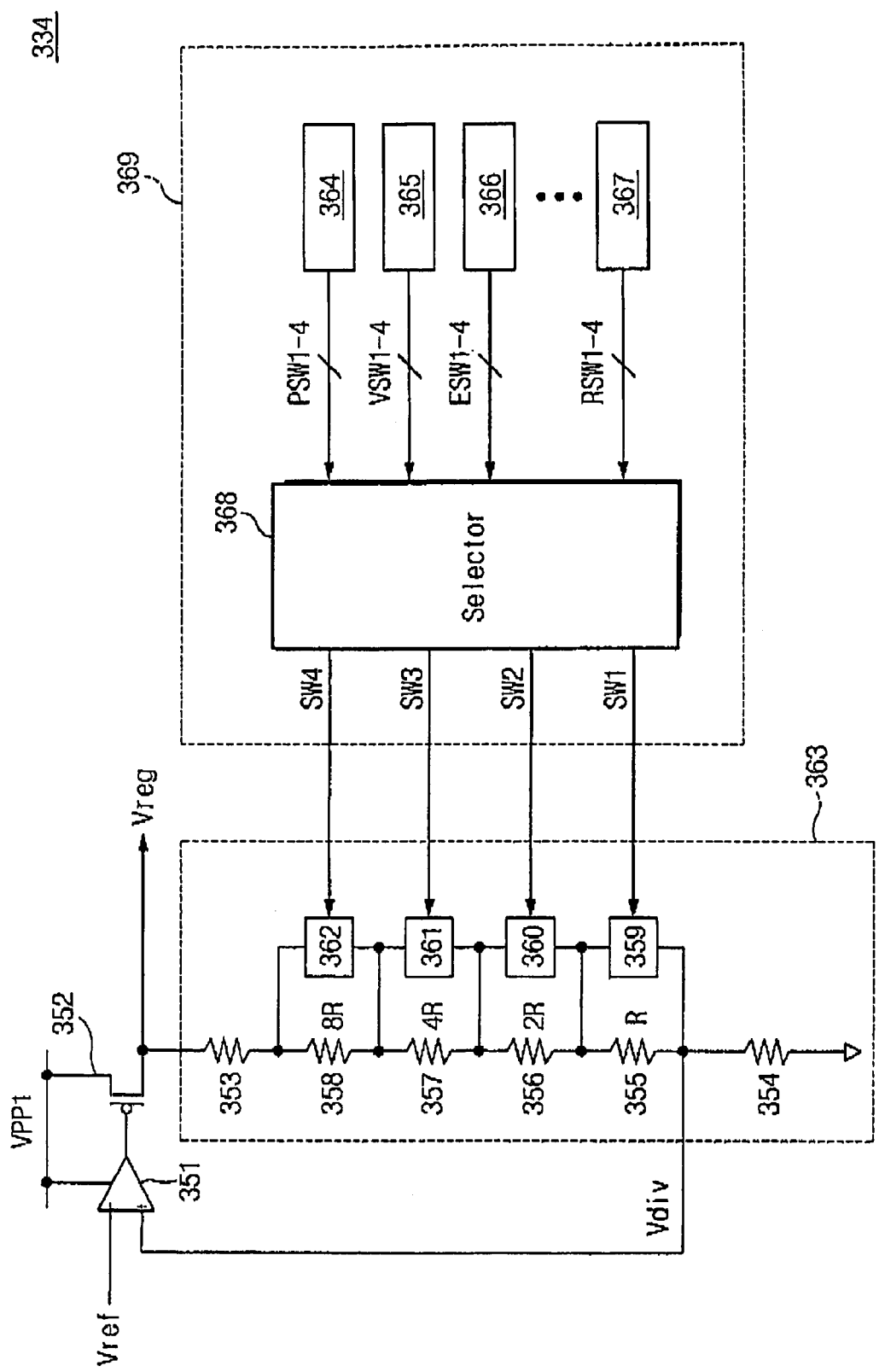
FIG. 8 is a circuit diagram of the voltage regulator shown in FIG. 7.

FIG. 8 is a circuit diagram of the voltage regulator 334. Referring to FIG. 8, the voltage regulator 334 includes a comparator 351, a PMOS transistor 352, a voltage divider 363, and a controller 369. The comparator 351, the PMOS transistor 352, and the voltage divider 363 are substantially the same as those shown in FIG. 1. Their description is, therefore, abbreviated. Unlike FIG. 1, the controller 369 outputs the control code having a fixed value or a varied value responsive to an operation mode.

Figure 9:
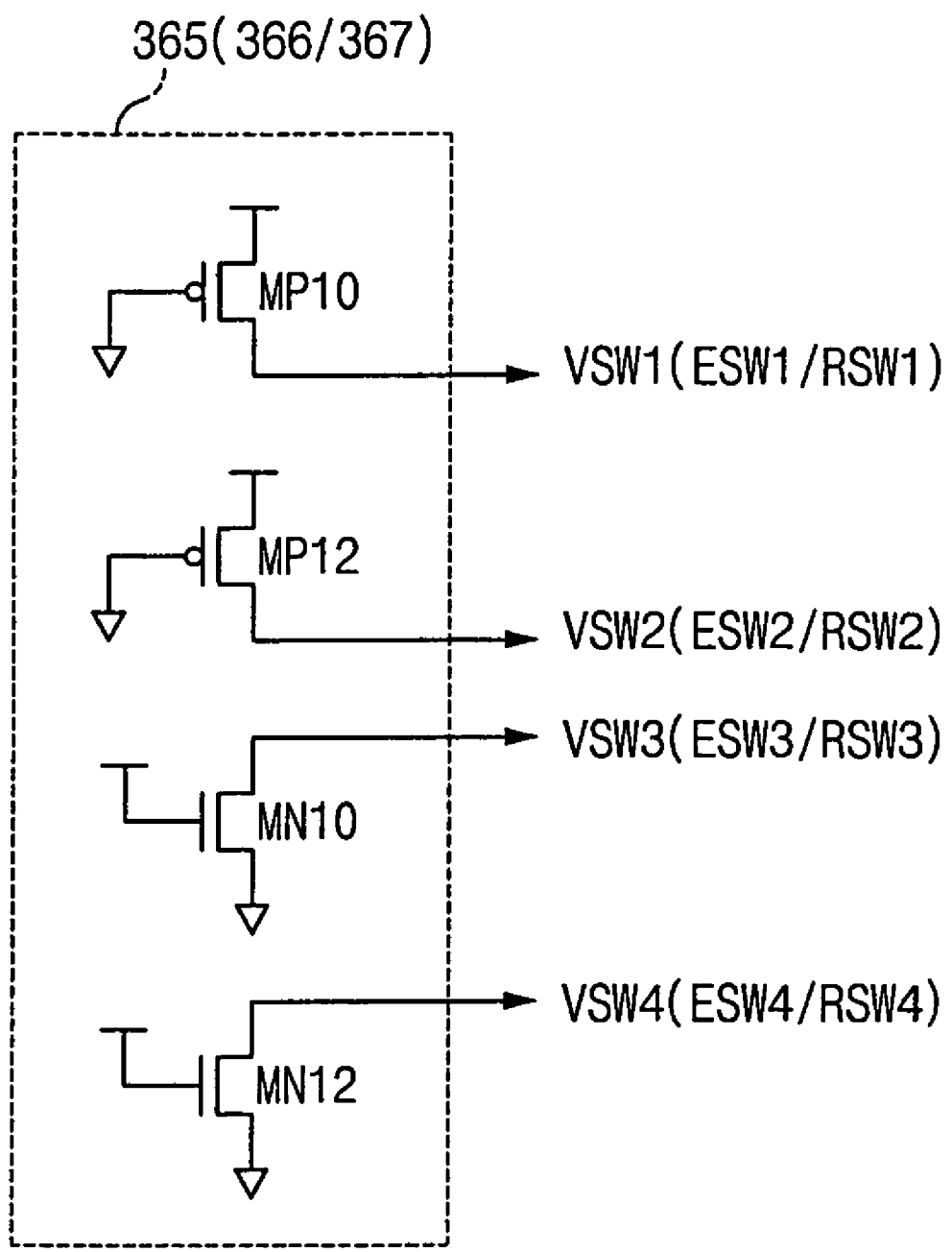
FIG. 9 is a circuit diagram of the signal generator shown in FIG. 8.

For instance, the signal generator 364 generates program control signals PSW1 to PSW4 at a program operation, and state program control signals PSW1 to PSW4 vary. The signal generator 364 comprises the counter as shown in FIG. 4. The signal generator 365 generates verification control signals VSW1 to VSW4 at the time of the program/erase verification operations, and the verification control signals VSW1 to VSW4 are constant. The signal generator 366 generates erase control signals ESW1 to ESW4 at the time of the erase operation and the erase control signals ESW1 to ESW4 are constant. The signal generator 367 generates read control signals RSW1 to RSW4 at a read operation and the read control signals RSW1 to RSW4 are constant. As shown in FIG. 9, the signal generators 364 to 367 are constructed using PMOS transistors MF10 and MP12 and NMOS transistors MN10 and MN12.

A controller 368 selects output signals responsive to an operation mode. The selector 368 outputs the selected signals as the control signals SW1 to SW4. For example, the selector 368 selects the output signals PSW1 to PSW4 from the signal generator 364 at the program operation and selects the output signals VSW1 to VSW4 from the signal generator 365 at verification operation. And the selector 368 selects the output signals ESW1 to ESW4 from the signal generator 366 at the erase operation and selects the output signals RSW1 to RSW4 from the signal generator 367 at the read operation.

Figure 10:
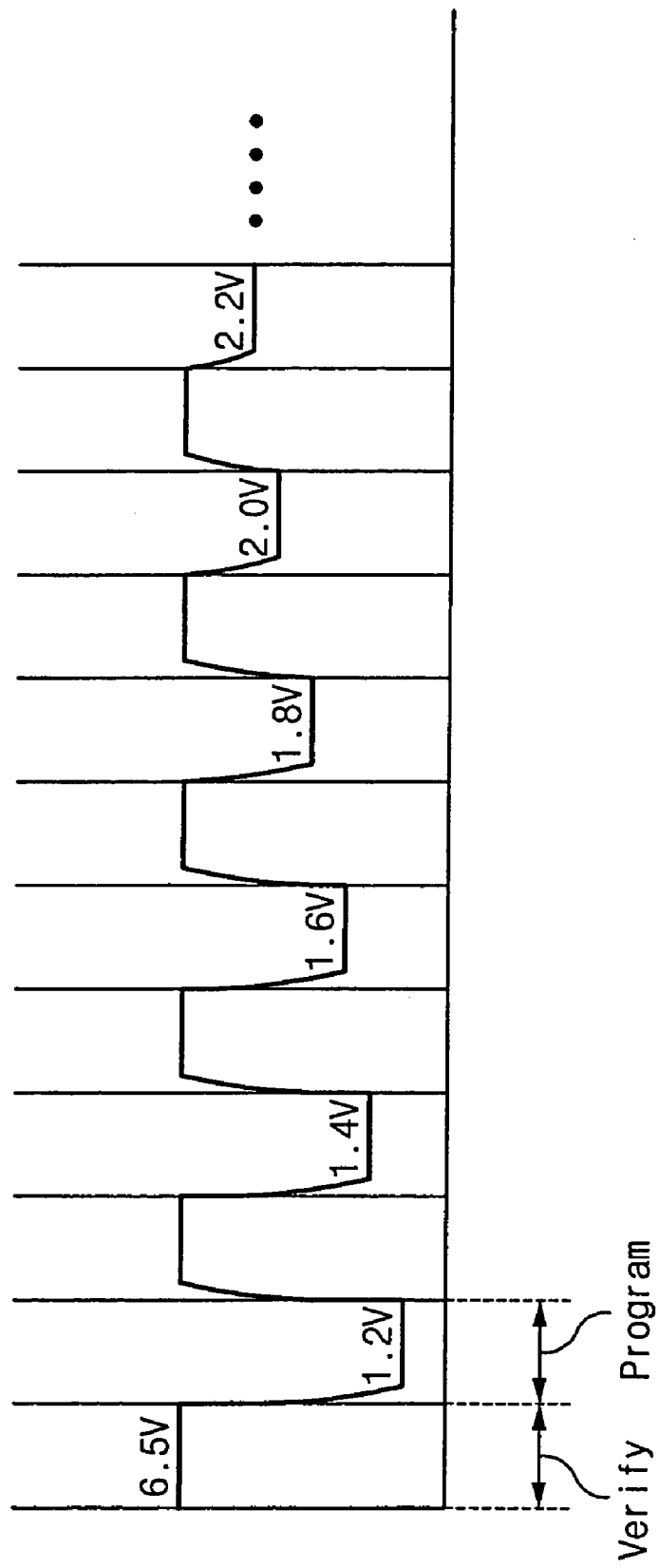
FIG. 10 is a timing diagram of a word line voltage in a program operation mode.

In case of the memory device for storing the multi-bit information, the well-known Incremental Step Pulse Programming (ISPP) method is used to obtain a compact cell distribution such that the word line voltage is controlled. For example, as shown in FIG. 10, the word line voltage is maintained to have a 6.5 V at program verification duration and is gradually increases by about 0.2 V at program durations. Whenever the program duration or operation begins, the output value of the counter 364 increases by one such that the regulated voltage Vreg is increased by ΔR. The inventive voltage regulator 334 is advantageous for the memory device for controlling the word line voltage through the ISPP method. In case the word line voltage is controlled using the ISPP method, the word line voltage gradually increases by 0.2V from 1.2V to 9V and as a result, the switches corresponding to 50 to 60 resistors are required. However, the inventive voltage regulator having the weighted resistor structure can be comprised of merely 5 to 6 weighted resistors.

The present invention is described using a NOR type flash memory as the non-volatile semiconductor memory device, but is not so limited. For instance, the invention can be applied to a NAND type flash memory.

As described above, the present invention uses weighted resistors in its voltage divider reducing the number of resistors and switches even though the multi-level voltage is generated.

Having illustrated and described the principles of our invention(s), it should be readily apparent to those skilled in the art that the invention(s) can be modified in arrangement and detail without departing from such principles. We claim all modifications coming within the spirit and scope of the accompanying claims.

We claim:

1. A voltage regulator circuit to regulate an input voltage and generate an output voltage, the voltage regulator circuit comprising:
   a voltage divider to generate a divided voltage;
   a comparator to compare the divided voltage to a reference voltage;
   a driver connected between an input voltage and an output voltage, the driver operating responsive to the comparator; and
   a controller to control the voltage divider with a control signal to gradually vary the output voltage;
   where the voltage divider includes
   a first resistance adapted to vary in a binary weighted form responsive to the controller; and a second resistance having a second fixed resistance serially connected to the first resistance.

2. The voltage regulator circuit of claim 1 where the controller comprises a counter to generate a control code responsive to a clock signal.

3. The voltage regulator circuit of claim 2 where the voltage divider comprises:
   a plurality of weighted resistors; and
   a plurality switches each connected in parallel to a corresponding weighted resistor and operating responsive to the control code.

4. The voltage regulator circuit of claim 3
   where the weighted resistor corresponding to a least significant bit of the control code has a smallest resistance value; and
   where the weighted resistor corresponding to the most significant bit of the control code has a largest resistance value.

5. The voltage regulator circuit of claim 3 where each of the switches comprises:
   first and second level shifters to receive corresponding control code bit signals;
   an inverter to receive an output signal from the first level shifter; and
   a transmission gate connected in parallel with a corresponding weighted resistor and operating responsive to the inverter and the second level shifter.

6. The voltage regulator circuit of claim 5
   where the first level shifter operates at a voltage larger than a power supply voltage; and
   where the second level shifter operates at the output voltage.

7. The voltage regulator circuit of claim 3
   where switches receiving least significant bits of the control code, comprise:
      first and second level shifters to receive corresponding control codes;
      an inverter to receive an output signal from the first level shifter; and
      a transmission gate connected in parallel with a corresponding weighted resistor and operating responsive to inverter and the second level shifter; and
   where switches receiving most significant bits of the control code, comprise:
      a third level shifter to receive a corresponding control code; and
      an NMOS transistor parallel connected with a corresponding weighted resistor, and operating responsive to the third level shifter.

8. The voltage regulator circuit of claim 7
   where the first and third level shifters operate at a voltage larger than a power supply voltage;
   where the second level shifter operates at the output voltage.

9. A voltage regulator circuit comprising:
   an input terminal to receive a high voltage;
   an output terminal to provide an output voltage therefrom;
   a plurality of resistors connected serially between the output terminal and a ground voltage;
   a plurality of switches each connected in parallel to a corresponding one of the resistors;
   a controller to generate control signals that operate the switches;
   a comparator to compare a divided voltage output from the plurality of resistors to a reference voltage; and
   a driver connected between the input terminal and the output terminal and operating responsive to the comparator;
   where the plurality of resistors comprises at least one weighted resistor, and a resistor having a fixed resistance serially connected to the weighted resistor.

10. The voltage regulator circuit of claim 9
    where the weighted resistor corresponding to a control signal of a least significant bit has the smallest resistance value; and
    where the weighted resistor corresponding to a control signal of most significant bit has the largest resistance value.

11. The voltage regulator circuit of claim 9 where the controller comprises an up counter.

12. The voltage regulator circuit of claim 9 where the controller comprises a down counter.

13. The voltage regulator circuit of claim 9 where each switch comprises:
    first and second level shifters to receive corresponding control signals;
    an inverter to invert an output signal of the first level shifter; and
    a transmission gate connected in parallel with a corresponding weighted resistor and operating responsive to the inverter and the second level shifter.

14. The voltage regulator circuit of claim 9
    where each switch that receives most significant bits of the control code, comprises:
       first and second level shifters to receive corresponding control signals;
       an inverter to receive an output signal of the first level shifter; and
       a transmission gate connected in parallel with a corresponding weighted resistor, and operating responsive to the inverter and the second level shifter; and
    where each switch that receives least significant bits of control code, comprises:
       a third level shifter to receive a corresponding control signal; and
       an NMOS transistor connected in parallel with a corresponding weighted resistor, and operating responsive to the third level shifter.

15. A semiconductor memory device, comprising:
    an array of memory cells arranged in a matrix of rows and columns;
    a decoder to decode one of the columns to supply the selected column with a word line voltage; and
    a word line voltage generating circuit to generate the word line voltage, where the word line voltage generating circuit comprises:
       a high voltage generator to generate a high voltage;
       a voltage divider to divide the high voltage;
       a comparator to compare divided voltage is to a reference voltage;
       a driver connected between the high voltage and the word line voltage and operating responsive to the comparator; and
       a controller to control the voltage divider to gradually vary the output voltage; and
       where the voltage divider includes
       a resistance unit having a first resistance value that varies in a binary weighted form responsive to the controller and a second resistance that is fixed serially connected to the first resistance value.

16. The semiconductor memory device of claim 15 where the resistance unit comprises:

a plurality of weighted resistors; and a plurality of switches connected in parallel to the plurality of weighted resistors.

17. The semiconductor memory device of claim 15 where a weighted resistor corresponding to a least significant bit of a control code has the smallest resistance value; and where the weighted resistor corresponding to a most significant bit of the control code has a largest resistance value.

18. The semiconductor memory device of claim 15 where the controller comprises a counter to generate the control code in synchronism with a clock signal.

19. The semiconductor memory device of claim 15 where the counter comprises any one of an up counter and a down counter.

20. The semiconductor memory device of claim 16, where each switch comprises:

first and second level shifters to receive corresponding control code;

an inverter to receive an output signal of the first level shifter; and a transmission gate connected in parallel with a corresponding weighted resistor, and operating responsive to the inverter and the second level shifter.

21. The semiconductor memory device of claim 16 where each switch that receives most significant control code bit signals comprises:

first and second level shifters to receive a corresponding control code bit signal;

an inverter to invert the output signal of the first level shifter; and a transmission gate connected in parallel with a corresponding weighted resistor, and operating responsive to the inverter and the second level shifter;

where each switch that receives less significant control code bit signals of the control code, comprises:

a third level shifter to receive a corresponding control code bit signal; and an NMOS transistor connected in parallel with a corresponding weighted resistor, and operating responsive to the third level shifter.

22. The semiconductor memory device of claim 15 where the controller comprises:

a first signal generator to generate a code of a gradually varying value;

a second signal generator to generate a code of a fixed value; and a selector to select one of the first and second signal generators according to an operation mode of the memory device as the control code.

23. The voltage regulator circuit of claim 1 where the controller comprises a plurality of flip flops.

24. The voltage regulator circuit of claim 9 where the controller comprises a plurality of flip flops, each flip flop being associated with one of the plurality of switches.

25. The semiconductor memory device of claim 15 where the controller includes a plurality of flip flops.

* * * * *

UNITED STATES PATENT AND TRADEMARK OFFICE
CERTIFICATE OF CORRECTION

| | | |
|---|---|---|
| PATENT NO. | : 7,002,869 B2 | Page 1 of 1 |
| APPLICATION NO. | : 10/794532 | |
| DATED | : February 21, 2006 | |
| INVENTOR(S) | : Zhang et al. | |

It is certified that error appears in the above-identified patent and that said Letters Patent is hereby corrected as shown below:

Column 6, line 8, please replace "MF10" with --MP12--

Signed and Sealed this

Thirtieth Day of January, 2007

JON W. DUDAS
*Director of the United States Patent and Trademark Office*